United States Patent [19]
Pandelisev

[11] Patent Number: 5,178,719
[45] Date of Patent: Jan. 12, 1993

[54] CONTINUOUS REFILL CRYSTAL GROWTH METHOD

[75] Inventor: Kiril A. Pandelisev, Mesa, Ariz.

[73] Assignee: Horiba Instruments, Inc., Irvine, Calif.

[21] Appl. No.: 747,360

[22] Filed: Aug. 20, 1991

[51] Int. Cl.⁵ ............................................. C30B 11/00
[52] U.S. Cl. .................... 156/616.4; 156/606; 156/616.41; 156/DIG. 71; 252/62.6; 252/62.62; 252/62.63
[58] Field of Search ............... 156/606, 616.4, 616.41, 156/DIG. 71; 252/62.6, 62.62, 62.63

[56] References Cited

U.S. PATENT DOCUMENTS

| | | | |
|---|---|---|---|
| 2,984,626 | 5/1961 | Lefever | 156/616.41 |
| 3,514,265 | 4/1970 | Pastore | 23/273 |
| 3,926,566 | 12/1975 | Spurney | 156/616.41 |
| 3,969,491 | 7/1976 | Pastor et al. | 156/DIG. 71 |
| 4,018,566 | 4/1977 | Zeuch et al. | 23/273 |
| 4,030,965 | 6/1977 | Hammond et al. | 156/616 |
| 4,036,595 | 7/1977 | Lorenzini et al. | 23/273 |
| 4,038,201 | 7/1977 | Hargreaves | 156/616.4 |
| 4,055,457 | 10/1977 | Swinehart | 156/616 |
| 4,086,424 | 4/1978 | Mellen. Sr. | 13/24 |
| 4,203,951 | 5/1980 | Goriletsky et al. | 156/DIG. 115 |
| 4,379,733 | 4/1983 | Pastor et al. | 156/616 |
| 4,547,258 | 10/1985 | Witter et al. | 156/605 |
| 4,666,681 | 5/1987 | Ferrand et al. | 422/248 |
| 4,834,832 | 5/1989 | Stock et al. | 156/620 |

FOREIGN PATENT DOCUMENTS 0548312 2/1977 U.S.S.R. .............. 156/617.1

Primary Examiner—Robert Kunemund
Assistant Examiner—Felisa Garrett
Attorney, Agent, or Firm—Poms, Smith, Lande & Rose

[57] ABSTRACT

Large crystals of alkali halide materials are presently produced using the Bridgman-Stockbarger method and result in state-of-the-art crystals of up to 30" in diameter and 20" in height. Both residual impurity concentrations and dopant concentrations have been difficult to control because the segregation coefficients are not equal to unity. As a result, the residual impurity and dopant concentrations can vary drastically across the length of the crystal. By adding additional charging material to the melt during the crystallization process, the residual impurity and dopant concentrations can be kept nearly constant throughout the length of the crystal. By adding charging material to the melt during crystallization, the overall length of a manufactured crystal can be increased dramatically.

8 Claims, 3 Drawing Sheets

CONTINUOUS REFILL CRYSTAL GROWTH METHOD

FIELD OF THE INVENTION

The present invention relates to a novel method for growth of alkali halide crystals with uniform residual impurity distribution (both in length and radial distribution) in undoped crystals, and uniform dopant distribution in the doped crystals.

The invention also discloses a new method for growth of crystals which are at least two times longer than the present state of the art allows.

BACKGROUND OF THE INVENTION

Growing ultrapure or doped single crystals having a low defect density and uniform residual impurity or dopant levels, respectively, over the crystal length as well as radially has always been difficult to achieve. The type of crystal and the method by which they are grown can contribute a great deal to the residual impurities or dopant distribution. The crystal defect density is also affected by the crystal growth rate, crystal size, and the temperature gradients in the furnace. Some post growth annealing is usually required to suppress one type of crystal defect or to generate another type of crystal defect as required by the particular use of the crystal.

Crystals comprised of a single element, two elements (binary compounds) or three elements (ternary compounds) have been the subject of numerous experiments and have found a wide range of applications. Silicon and Group III-V compounds, Gallium-Arsenide (GaAs) in particular, are used for single device or integrated circuit fabrication. The alkali halide crystals have found numerous applications in the area of nuclear physics, medical imaging, and high energy physics.

Most of the high energy facilities today have a detector chamber consisting of approximately 10,000 crystals of CsI having an average size of $4 \times 4 \times 12$ inches. The high resolution within a wide energy range makes it possible to analyze various particle-particle interactions. Sodium Iodide ((NaI) (Tl)) is frequently used in the area of medical imaging. Plates of various shapes and sizes are used to image particular sections of the human body. The optimal goal of using a single plate capable of scanning the entire human body in a single event has yet to be achieved. The present limitation is mainly due to the state of the art of the crystal growth process.

To produce alkali halide crystals which will be at least double in length and will have a uniform residual impurity/dopant distribution a new method has been proposed. Up to now, alkali halide crystals are produced exclusively in a batch method using either the Bridgman-Stockbarger or Kyropolos methods. Part of the difficulty in using continuous growth methods for alkali halide crystals is their water soluble characteristics, and their tendency to absorb and retain water during the liquefication and crystallization process.

This application deals with an improved method for growing alkali halide crystals of vastly improved quality for experimentation and production.

Alkali halide crystals are usually grown by the Bridgman-Stockbarger method of crystal growth. The Bridgman-Stockbarger method utilizes a heated chamber which is divided into a upper and lower heated area. These areas are separated by a baffle to allow independent control of the temperature in the upper and lower portions of the chamber. The upper section of the chamber is heated to a temperature of approximately 50°–150° C. above the melting point of the crystal and the lower section is maintained at a temperature slightly below the melting point of the crystal. Thus, the flow of heat is from the upper section of the chamber downwards through the melt. This will cause crystallization to begin at the lower section and proceed upwards through the melt as the crystal is lowered from the upper portion of the chamber into the lower portion. During the growth of the crystal, the temperature of the melt is higher in the melt than it is at the interface to the growing crystal or at the lower surface.

During the melt down of the charging material, the crucible is positioned in the upper section of the chamber. All air is evacuated, then an inert gas such as nitrogen is added at a pressure of 1 to 5 PSI above the ambient pressure in the room. The inert gas will not react with the alkali halide and will also serve to suppress evaporation of the melt itself. This slight over pressurization with an inert gas also reduces impurities by preventing any outside contaminants from leaking into the crystallization furnace. Occasionally, a small amount of certain other gases, called scavengers, are added to the chamber in order to react with and draw out other impurities which are known to exist within the melt.

After the alkali halide is completely melted and a desirable temperature is established in the melt, the crucible is slowly lowered in the chamber past the baffle into the cooler lower section. The alkali halide crystallizes from the bottom of the melt on up as the temperature in the melt drops below the melting point in the vicinity of the baffle. The melt-to-crystal interface remains nearly stationary in horizontal proximity to the baffle with a slow downward movement of the crucible.

The temperature gradient in the melt along with the interface is maintained in a fairly steady state by close control of the power applied to the heaters in both the upper and lower portions of the chamber. This also results in a quiet melt, which is devoid of turbulence. This allows all impurities or dopants to diffuse uniformly throughout the melt, and allows the lattice structure of the crystal to form without defects.

Prior work in the area includes the work of Hammond et al. in U.S. Pat. No. 4,030,965 which addresses the particular problem of bubble formation within the melt and the resulting crystal.

Swinehardt in U.S. Pat. No. 4,055,457 address metal impurities found in trace amounts in alkali halides grown with the Stockbarger and Kyropolos methods. Swinehardt concerned himself primarily with optical characteristics of potassium and sodium salts.

Swinehardt found quartz crucibles most suitable for crystallization and platinum completely unsuitable. Swinehardt also noted the shrinkage of charging material once melted. This particular problem stems from the fact that the packing density of the powder used to load the crucible is well below the packing density of the crystalline material. For example, charging material such as packed Sodium Iodide powder has a packing density of approximately 1.5–1.6 grams per cubic centimeter, and granular Sodium Iodine has a slightly higher packing density of approximately 1.75 grams per cubic centimeter. Crystalline Sodium Iodine has a packing density of approximately 3.67 grams per cubic centimeter. A crucible tightly packed with Sodium Iodine in either granular or powdered form will produce a crystal whose height is less than one half the height of the crucible.

Lorenzini et al in U.S. Pat. No. 4,036,595, Witter et al in U.S. Pat. No. 4,547,258, and Stock et al in U.S. Pat. No. 4,834,832 each suggested methods for continuous growing of crystalline material. Lorenzini and Witter both addressed their attention to the Czochralski and Kryopolos method of drawing a crystal upwards from a melt. Both Lorenzini and Witter support continuous flow processes. However, by their very nature, they lead to the creation of turbulence within the melt. This will lead to defects forming within the lattice structure of the crystal.

Lorenzini, Witter, and Stock all direct their attention to growing semiconductor crystals, particularly silicon, and it is not quite applicable for growth of alkali halides.

The invention of Stock, et al. involves dropping molten Silicon onto the top of an existing melt and drawing a crystal downwards through a cooling zone. The Stock method calls for continuous adding of granular silicon material and eliminates the use of a crucible.

In actual operation, alkali halides are extremely difficult to consistently dope with particular materials. This is because several dopants that are popularly used have segregation coefficients that are not equal to unity. Thus, if an over-all melt has a predetermined dopant concentration, as the crucible is lowered, the crystallized material will have a substantially lower concentration, with the concentration of dopant in the melt increasing correspondingly. This means that the dopant concentration can very drastically from one end of the crystal to the other. For example, Thallium distribution in Sodium Iodide or Cesium Iodide crystals from start to finish may vary by more than 20 times from the bottom to the top of the crystallization crucible. This leads to single crystal quality degradation due to the dopant segregation.

SUMMARY OF THE INVENTION

It is therefore a general object of this invention to provide a new and improved process for the growing of essentially ultra pure crystals of alkali halides in a Bridgman-Stockbarger furnace. It is another general object of this invention to provide a new and improved process for growing crystals which when finished will fully occupy the crucible by causing additional charging material to be heated and added to the crucible. It is further a general object of this invention to provide a new and improved process for growing of alkali halide crystals in which the dopant concentration throughout the entire crystal is essentially uniform, despite segregation coefficients which may be much greater or much less than unity.

It is still another specific object of the invention to provide a process by which the residual impurity concentration in doped or undoped crystals can be controlled and maintained at a constant level throughout the entire crystal.

These and other objects, features and advantages of this process, and the ingots grown therewith, will become apparent to those skilled in the art from the following description of the preferred forms thereof and the examples set forth herein.

DESCRIPTION OF AN EXEMPLARY PREFERRED EMBODIMENT

Figure 1:
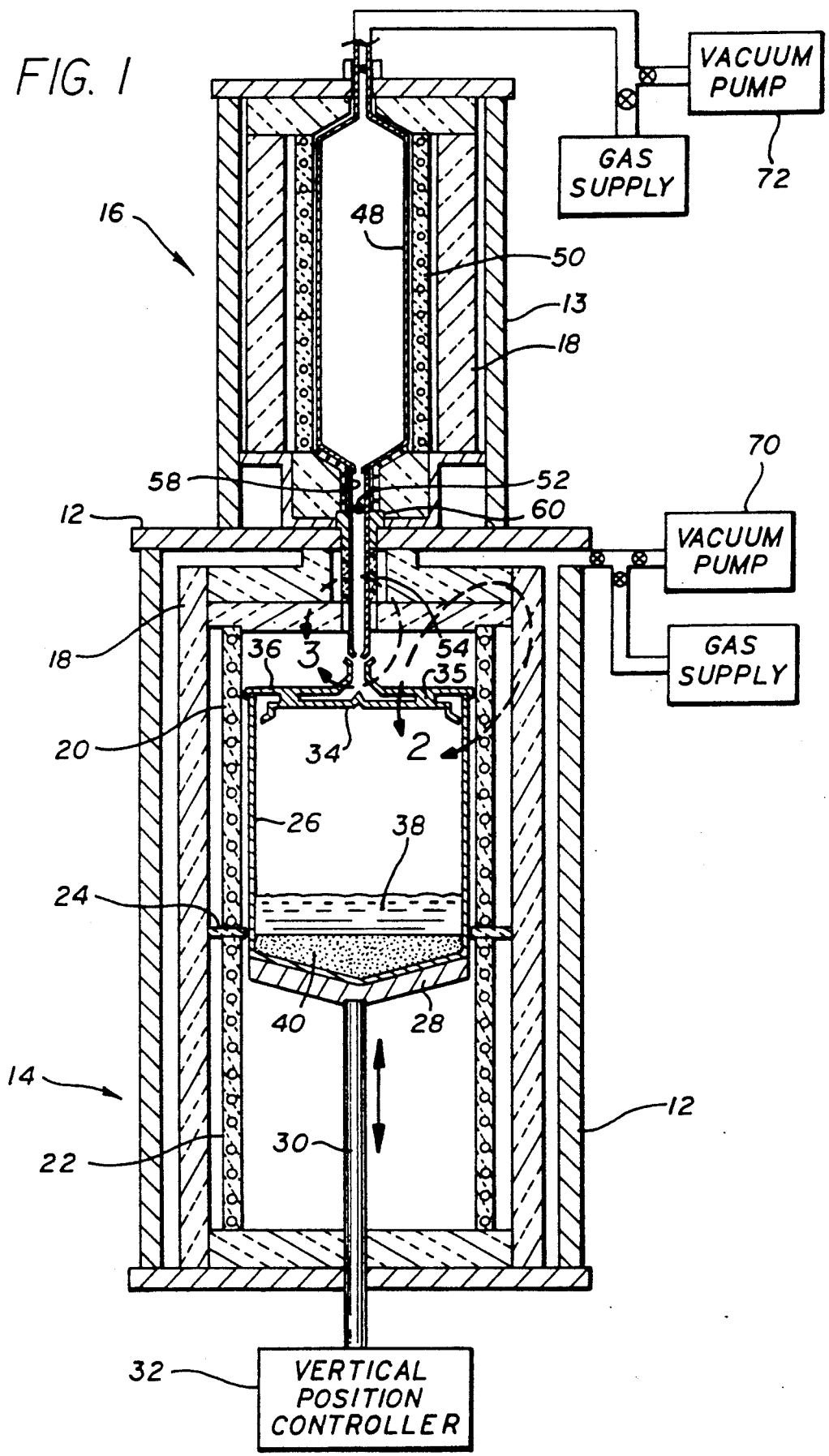
FIG. 1 is a diagrammatic illustration, in an elevation cross section view, of a Bridgman-Stockbarger furnace which has been modified to permit the addition of liquefied charging material to the melt.

Referring to FIG. 1, there is shown a stainless steel casing 12, surrounding the Bridgman-Stockbarger furnace 14. The stainless steel casing provides a sealed enclosure for the Bridgman-Stockbarger furnace 14 and helps ensure uniform heat distribution within the furnace. The casing also allows the Bridgman-Stockbarger furnace 14 to be evacuated of all gas or air, as well as flooded with a predetermined gas under low pressure. A recharging chamber 16 consisting of a supplemental reservoir 48 is also surrounded by stainless steel casing 13. The supplemental reservoir is connected to a vacuum pump 72 and pressure system and can be evacuated, or pressurized with a predetermined gas.

Within the stainless steel exterior is a layer of insulation 18 which surrounds both the Bridgman-Stockbarger furnace and the supplemental reservoir. The Bridgman-Stockbarger furnace contains an upper heater 20 and a lower heater 22 which are operated independently to separately control the temperature of the upper and lower portion of the Bridgman-Stockbarger furnace. A baffle 24 serves to separate the upper and lower portions of the chamber and provide a starting point for a thermal gradient to form. The thickness of the baffle determines the magnitude of the thermal gradient. A baffle one inch thick made of insulating material is used. [Baffle thickness of 1 to 2 inches is acceptable].

Crystallization of the melt in the crucible will occur at or near the level of the baffle depending on the heater temperatures of the upper and lower portions of the chambers. The crucible 26 is made of either platinum or quartz, and rests on a metal pedestal 28. A platinum crucible is preferred because it is easily reused, whereas the quartz crucible is typically reused only a few times. The base 28 on which the crucible rests is attached to a drive and support shaft 30 which is driven by a stepper motor or other positioning apparatus 32.

Figure 2:
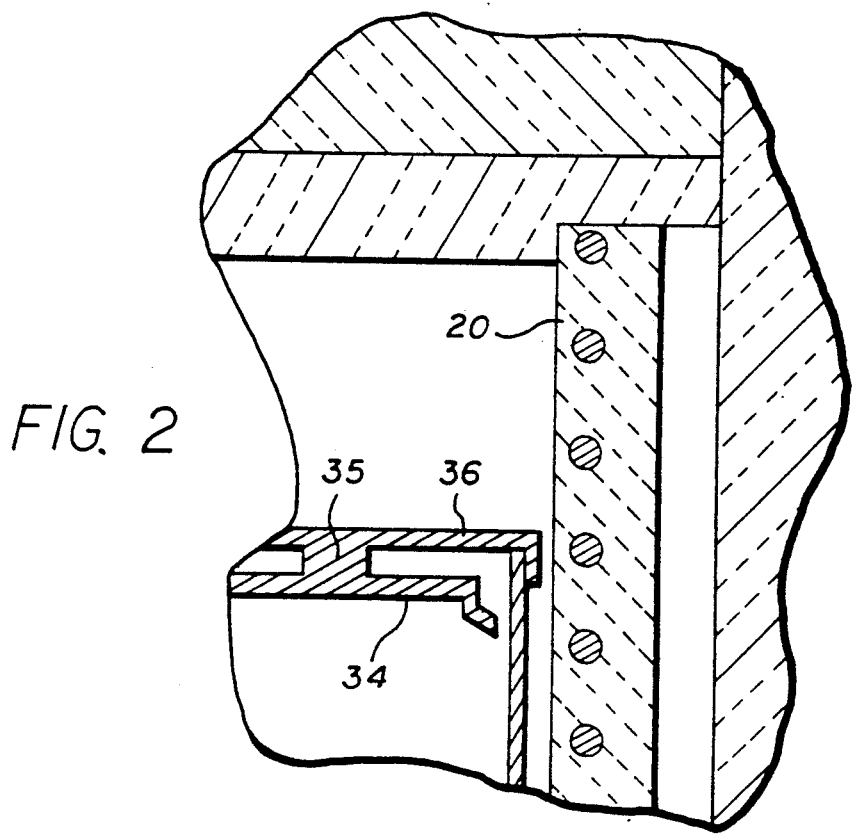
FIG. 2 is a diagrammatical illustration, in an elevation cross section view, of one portion of the apparatus of FIG. 1 as indicated at area 2 thereof which is used to allow additional melted charging material to enter the melt without creating turbulence within the melt.
Figure 3:
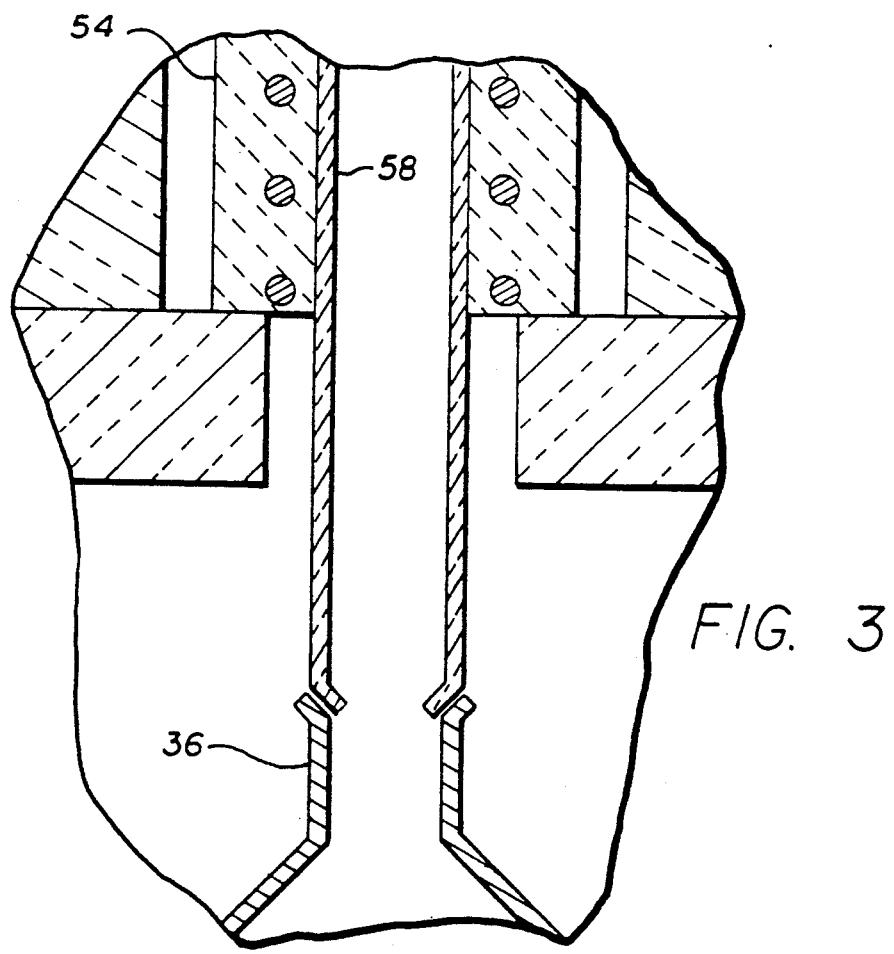
FIG. 3 is a diagrammatical illustration, in an elevation cross section view, of another portion of the apparatus of FIG. as indicated at area 3 there at, showing the point at which additional liquefied charging material enters the Bridgman-Stockbarger furnace.

As shown in FIGS. 2 and 3, A modified lid consisting of an inner, lower lid plate 34 and an outer, upper lid plate 36 assures both a good seal and melt flow into the crucible. The lower lid plate 34 directs liquefied charging material into the crucible along the walls of the crucible so as to minimize turbulence within the melt 38. The upper lid plate 36, is secured to the lower lid plate 34, in any suitable manner, such as by spot welds 35, which assure good sealing of the lid. The upper lid plate is spaced from and secured to the lower lid plate 34 to support the lower lid plate. Both the upper and lower lid plates 34 and 36 are made of quartz or platinum.

Figure 4:
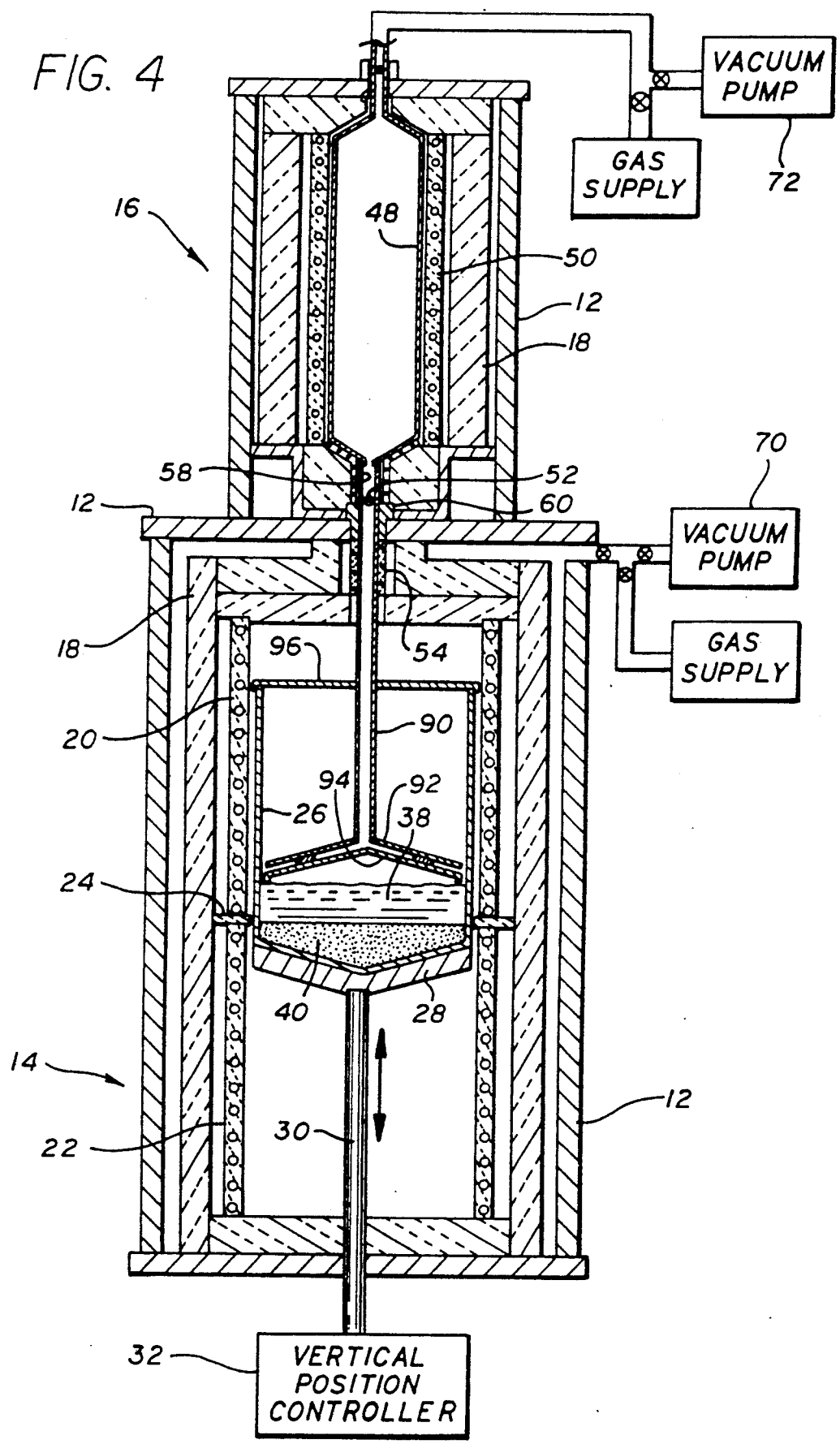
FIG. 4 is a diagrammatic illustration, in an elevation cross section view, of a Bridgman-Stockbarger furnace which has been modified to permit the addition of liquefied charging material to the melt and shows an alternate modified lid.

Another modified lid as shown in FIG. 4 may be used to introduce additional liquefied charging material to the melt at a level slightly above the melt level. In this configuration, an elongated conduit 90 is secured to upper lid plate 92. Lower lid plate 94 is secured to upper lid plate 92 in the same manner and configuration as upper lid plate 36 is secured to lower lid plate 34. Upper lid plate 92 has an outer diameter slightly less than the inner diameter of the crucible, allowing the crucible and lid to move freely relative to each other in the vertical direction.

The length of conduit 90 is such that the lid is maintained at a level above the baffle 24. Using this configuration, the melt is begun with less charging material, and additional charging material is added regularly to maintain a fairly constant melt level, slightly below the position of lower lid plate 94. An additional cover plate 96 may be placed over the crucible. Cover plate 96 has an opening in it to allow the conduit 90 to pass through cover plate 96.

An additional configuration of a modified lid similar to the configuration of upper lid plates 36 and lower lid plate 34 and having a multiple section conduit which is continuously adjustable in the vertical direction is also contemplated but is not shown.

An amount of crystallized material 40 is shown for the purpose of explanation. Crystal formation will occur near the baffle 24 and will begin at the bottom of the crucible and propagate upwards within the crucible as the entire crucible is lowered towards and past the baffle.

The supplemental reservoir 48 is surrounded by an additional heating element 50 whose temperature can be controlled independently of the Bridgman-Stockbarger furnace heating elements. In this manner additional charging material can be liquefied and released into the Bridgman-Stockbarger furnace through valve 52. An additional heating element 54 is located below the valve but above the crucible lid. Its temperature is controlled independently of any of the other heating elements. The goal in adding liquefied charging material to the melt is to heat the material to be added to the same temperature as the melt so that upon its addition to the melt, no thermal instability is introduced and no eddy currents formed due to thermal instability.

The liquefied charging material flows from the quartz reservoir 48 through valve 52 and is conveyed to the Bridgman-Stockbarger furnace through a quartz conduit 58. The conduit 58 is surrounded by a glass to metal seal 60. Both the recharging chamber and the Bridgman-Stockbarger furnace are connected to vacuum pumps 72 and 70 respectively so that they can be evacuated of all air or other gases such as water vapor. Additionally, both chambers can be flooded with an inert gas (such as nitrogen) or hygroscopic or other material that may be used to further purify the melt and the resulting crystal.

There are many alternative embodiments possible including the use of multiple recharging chambers, arranging several recharging chambers, each containing a particular dopant to be added to the melt at a particular point, thus allowing a single crystal to be grown which has several different dopants with various concentrations along various sections of the length of the crystal. Additional refinements or modifications of the valving arrangement can be made so that heavy metals can be precipitated out and discharged from the chamber so that they do not enter into the melt, thus allowing a more highly purified crystal to be grown.

In the case of doping Sodium Iodide or Cesium Iodide crystals with the dopant Thallium, the initial concentration of Thallium in the melt is made somewhat higher than is desired in the crystal, and the crystallization segregation coefficient reduces the concentration to the desired level. Relatively pure Sodium Iodide or Cesium Iodide is then added from the supplemental reservoir 16, so that the desired concentration in the growing crystal is maintained.

One type of crystal which is grown in this furnace is Sodium Iodide. Sodium Iodide finds usefulness as a scintillation detection apparatus, generating light output when impacted with gamma radiation. For Sodium Iodide to effectively operate, it must be doped with Thallium. A proper ratio of Sodium Iodide to Thallium Iodide which is added to the melt is 150 kilograms of Sodium Iodide to 333 grams of Thallium Iodide. This will result in 0.1% doping by weight, at the beginning of the crystal growth process.

For instance, if the melt in the crucible within the Bridgman-Stockbarger furnace is begun with 150 kilograms of Sodium Iodide we have to add 333 grams of Thallium Iodide. Because of the segregation coefficient of Thallium causing the concentration of Thallium Iodide in the melt to be greater than the concentration in the crystal, this will result in a Thallium Iodide concentration within the Sodium Iodide crystal of approximately 0.1%. Additional undoped charging material is added to the supplemental reservoir and liquefied. The supplemental reservoir is filled to capacity before liquefication is begun. The exact quantity of Sodium Iodide which are added to the melt in the crucible is controlled by the valve 52.

The melt in the crucible is maintained at a temperature of approximately 50°-100° C. above the melting point of Sodium Iodide. The heater 20 in the upper part of the Bridgman-Stockbarger furnace is used to achieve this temperature. The heater 22 in the lower part of the Bridgman-Stockbarger furnace is set to maintain a temperature of the lower part of the furnace at approximately 645° C. This establishes the required thermal gradient across the baffle. The crucible containing the melt is lowered from the top part of the Bridgman-Stockbarger furnace into the lower part of the furnace at a rate of approximately 0.8 to 2 millimeters per hour. The crystal growth process may be halted for a short period of time, ($\frac{1}{2}$ to 2 hours) when large quantities of additional liquefied charging material are added to the melt and to allow for temperature stabilization. This is done to allow the dopant to diffuse uniformly throughout the melt. The precise amount of time depends on the quantity of Sodium Iodide which is added to the melt.

In one specific embodiment of the invention, the crucible itself is 25" in diameter and 28" in height. When crystal growth is completed, it will contain a single crystal of Sodium Iodide having a simple cubic lattice structure doped with Thallium Iodide weighing approximately 500 kilograms. The Bridgman-Stockbarger furnace itself is approximately 49" in diameter and 77.5" in height. Attached to the top of the Bridgman-Stockbarger furnace is the recharging chamber which is 32$\frac{1}{2}$" in diameter and 46" in height. The baffle and insulating material are comprised of pressed fibers with favorable thermal characteristics and may be made of High-Temperature Mortar Ceramic Blanket available from Southwestern MacArthur Co. of Phoenix, Arizona, or an equivalent. This same material also surrounds the heating elements, and comprises the insulation material surrounding the upper reservoir. The outer casing is made of stainless steel, 2 inches thick and around the Bridgman-Stockbarger furnace, and ¼ inch thick around the supplemental reservoir. The crucible itself is made of Platinum. Quartz may also be sued to form a crucible in this application, however, due to present manufacturing techniques, this size quartz crucible is extremely expensive. Additionally, because of the weight involved, the quartz crucible would have a thickness of approximately 1". This would reduce the maximum possible diameter of the crystal. The Glass to metal Seal is made of an alumina-copper compound available from Larson Electronic Glass, or an equivalent.

There has been described hereinabove a novel apparatus and method for growing essentially single crystals of substantially uniform composition according to the principles of the invention as described hereinabove. Those skilled in the art may make numerous uses of an departures from the above described method and apparatus without departing from the inventive spirit and scope of the invention. Thus, by way of the example and not of limitation, the apparatus may be employed to grow crystals of compounds or materials in addition to those disclosed herein. Further, the size, shape and mode of heating of the apparatus may be varied from the dimensions aforementioned in keeping with the principles and teachings of the present invention.

I claim:

1. A method of growing essentially single crystals of substantially uniform composition comprising the steps of:
   forming a melt of an alkali halide salt in a crucible;
   progressively cooling the metal to crystalize the alkali halide salt in said crucible in a Bridgman-Stockbarger type furnace apparatus; and
   adding additional liquefied charging material to the melt in the crucible after crystallization has begun;
   wherein the alkali halide salt includes a dopant and wherein the crystallization step normally increases the concentration of the dopant in the melt as compared with the crystallized alkali halide salt; and
   wherein the step of adding additional material involves adding alkali halide salt having less dopant than is present in said melt;
   whereby the dopant concentration in the crystallized alkali halide salt is maintained substantially constant.

2. A method as set forth in claim 1 in which the alkali halide salt consists of only metal alkali halides, and the halides are either Iodine or Bromine.

3. A method as set forth in claim 2 in which the metal alkali halide salt is Cesium Iodide or Sodium Iodide.

4. A method as set forth in claim 3 in which the dopant is Thallium Iodide.

5. A method of growing essentially single crystals of substantially uniform composition comprising the steps of:
   forming a melt of an alkali halide salt in a crucible;
   progressively cooling the melt to crystalline the alkali halide salt in said crucible in a bridgman-Stockbarger type furnace apparatus; and
   adding additional liquefied charging material to the metal in the crucible after crystallization has begun;
   wherein the alkali halide salt includes impurities and wherein the crystallization step normally increases the concentration of the dopant in the metal as compared with the crystallized alkali halide salt;
   wherein the step of adding additional material involves adding alkali halide salt having less impurity concentration than is present in said melt; and
   whereby the impurity concentration in the crystallized alkali halide salt is maintained substantially constant.

6. A method of growing essentially single crystals of substantially uniform composition comprising the steps of:
   forming a melt of an alkali halide salt in a crucible;
   progressively cooling the melt to crystalize the alkali halide salt in said crucible in a Bridgman-Stockbarger type furnace apparatus; and
   adding additional liquefied charging material to the melt in the crucible after crystallization has begun;
   wherein the alkali halide salt includes a dopant; and
   wherein the step of adding additional material involves adding alkali halide salt having different dopant concentration than is present in said melt.

7. A method as set forth in claim 6 whereby the dopant concentration in the crystallized alkali halide salt is controlled from the beginning of the crystal to the end.

8. A method of growing essentially single crystals of substantially uniform composition comprising the steps of:
   forming a melt of an alkali halide salt in a crucible;
   progressively cooling the metal to crystalize the alkali halide salt in said crucible in a Bridgman-Stockbarger type furnace apparatus; and
   adding additional liquefied charging material to the metal in the crucible after crystallization has begun;
   wherein the alkali halide salt includes a dopant;
   wherein the step of adding additional material involves adding alkali halide salt having different dopant concentration than is present in said melt; and
   whereby the dopant concentration in the crystallized alkali halide salt remains essentially constant from the beginning of the crystal to the end.

* * * * *